United States Patent
Kim

(10) Patent No.: US 8,581,620 B2
(45) Date of Patent: Nov. 12, 2013

(54) SEMICONDUCTOR DEVICE INCLUDING DATA OUTPUT CIRCUIT SUPPORTING PRE-EMPHASIS OPERATION

(75) Inventor: Mi-Hye Kim, Gyeonggi-do (KR)

(73) Assignee: Hynix Semiconductor Inc., Gyeongg-do (KR)

( * ) Notice: Subject to any disclaimer, the term of this patent is extended or adjusted under 35 U.S.C. 154(b) by 0 days.

(21) Appl. No.: 13/333,927

(22) Filed: Dec. 21, 2011

(65) Prior Publication Data
US 2013/0076395 A1 Mar. 28, 2013

(30) Foreign Application Priority Data
Sep. 27, 2011 (KR) .................. 10-2011-0097531

(51) Int. Cl.
*H03K 17/16* (2006.01)
(52) U.S. Cl.
USPC .......................................... 326/30
(58) Field of Classification Search
USPC .......................................... 326/30
See application file for complete search history.

(56) References Cited

U.S. PATENT DOCUMENTS

| | | | | |
|---|---|---|---|---|
| 7,545,164 B2* | 6/2009 | Song et al. | .................. | 326/30 |
| 7,728,620 B2* | 6/2010 | Kuzmenka | .................. | 326/30 |
| 7,843,211 B2* | 11/2010 | Kim et al. | .................. | 326/30 |
| 7,969,197 B2* | 6/2011 | Muraoka et al. | .................. | 326/86 |
| 2004/0145394 A1* | 7/2004 | Nedachi | .................. | 327/112 |
| 2005/0057280 A1* | 3/2005 | Groen et al. | .................. | 326/86 |
| 2006/0071687 A1* | 4/2006 | Kim | .................. | 326/82 |
| 2006/0071688 A1* | 4/2006 | Uenishi | .................. | 326/82 |
| 2007/0285120 A1* | 12/2007 | Venditti et al. | .................. | 326/30 |
| 2008/0165594 A1* | 7/2008 | Kim | .................. | 365/189.11 |
| 2011/0128037 A1* | 6/2011 | Lee | .................. | 326/30 |
| 2011/0215830 A1* | 9/2011 | Muraoka et al. | .................. | 326/30 |

FOREIGN PATENT DOCUMENTS

KR 10-0688567 3/2007
KR 10-2011-0060713 6/2011

* cited by examiner

*Primary Examiner* — Thienvu Tran
(74) *Attorney, Agent, or Firm* — IP & T Group LLP

(57) ABSTRACT

A semiconductor device includes a code generator configured to generate a supplementary code with a value changing in response to a variation of an impedance code, a main driver configured to receive an output data and drive the received output data to a data output pad, wherein a driving force of the main driver is controlled according to the impedance code, and an auxiliary driver configured to receive the output data and drive the received output data to the data output pad, wherein a driving force of the auxiliary driver is controlled according to the supplementary code.

18 Claims, 11 Drawing Sheets

| ZQ_NCODE | | | EM_NCODE | | |
|---|---|---|---|---|---|
| <2> | <1> | <0> | <1> | <0> | |
| 0 | 0 | 0 | 0 | 0 | FIRST REGION (HIGH_VDD) |
| 0 | 0 | 1 | 0 | 0 | |
| 0 | 1 | 0 | 0 | 1 | SECOND REGION (NORMAL_VDD) |
| 0 | 1 | 1 | 0 | 1 | |
| 1 | 0 | 0 | 0 | 1 | |
| 1 | 0 | 1 | 1 | 1 | THIRD REGION (LOW_VDD) |
| 1 | 1 | 0 | 1 | 1 | |
| 1 | 1 | 1 | 1 | 1 | |

| ZQ_PCODE | | | EM_PCODE | | |
|---|---|---|---|---|---|
| <2> | <1> | <0> | <1> | <0> | |
| 1 | 1 | 1 | 1 | 1 | FIRST REGION (HIGH_VDD) |
| 1 | 1 | 0 | 1 | 1 | |
| 1 | 0 | 1 | 0 | 1 | SECOND REGION (NORMAL_VDD) |
| 1 | 0 | 0 | 0 | 1 | |
| 0 | 1 | 1 | 0 | 1 | |
| 0 | 1 | 0 | 0 | 0 | THIRD REGION (LOW_VDD) |
| 0 | 0 | 1 | 0 | 0 | |
| 0 | 0 | 0 | 0 | 0 | |

SEMICONDUCTOR DEVICE INCLUDING DATA OUTPUT CIRCUIT SUPPORTING PRE-EMPHASIS OPERATION

CROSS-REFERENCE TO RELATED APPLICATIONS

The present application claims priority of Korean Patent Application No. 10-2011-0097531, filed on Sep. 27, 2011, which is incorporated herein by reference in its entirety.

BACKGROUND

1. Field

Exemplary embodiments of the present invention relate to a semiconductor designing technology, and more particularly, to a semiconductor device including a data output circuit that supports a pre-emphasis operation.

2. Description of the Related Art

FIG. 1 is a block diagram illustrating a conventional data output circuit.

Referring to FIG. 1, the conventional data output circuit includes a pull-up pre-main driver 110, a pull-up main driver 120, a pull-down pre-main driver 130, and a pull-down main driver 140.

The pull-up pre-main driver 110 and the pull-down pre-main driver 130 invert and drive an output data OUT_DATA and output a pull-up driving data PU_PMDATA and a pull-down driving data PD_PMDATA.

The pull-up main driver 120 drives a data output pad DQ with an external power source voltage VDD in a period where the pull-up driving data PU_PMDATA is in a logic low level.

The pull-down main driver 140 drives the data output pad DQ with an external ground voltage VSS in a period where the pull-down driving data PD_PMDATA is in a logic high level.

As described above, since the conventional data output circuit performs the operation of driving the data output pad DQ with the external power source voltage VDD or the external ground voltage VSS according to the logic level of the applied output data OUT_DATA, the actual voltage level of the data output pad DQ may vary significantly.

SUMMARY

An embodiment of the present invention is directed to a semiconductor device including a data output circuit that supports a pre-emphasis operation that may vary the operation dividing force in response to a variation in process, voltage and temperature (PVT).

In accordance with an embodiment of the present invention, a semiconductor device includes: a code generator configured to generate a supplementary code with a value changing in response to a variation of an impedance code; a main driver configured to receive an output data and drive the received output data to a data output pad, wherein a driving force of the main driver is controlled according to the impedance code; and an auxiliary driver configured to receive the output data and drive the received output data to the data output pad, wherein a driving force of the auxiliary driver is controlled according to the supplementary code.

In accordance with another embodiment of the present invention, a semiconductor device includes: a code generator configured to generate a pull-up supplementary code and a pull-down supplementary code, wherein the pull-up supplementary code and the pull-down supplementary code change in response to a variation of a pull-up impedance code and a variation of a pull-down impedance code, respectively; a pull-up driver configured to receive an output data and pull-up drive a data output pad by using a plurality of main pull-up drivers and a plurality of auxiliary pull-up drivers; and a pull-down driver configured to receive the output data and pull-down drive the data output pad by using a plurality of main pull-down drivers and a plurality of auxiliary pull-down drivers, wherein the main pull-up drivers are controlled to be turned on/off in response to the pull-up impedance code and the auxiliary pull-up drivers are controlled to be turned on/off in response to the pull-up supplementary code, and the main pull-down drivers are controlled to be turned on/off in response to the pull-down impedance code, and the auxiliary pull-down drivers are controlled to be turned on/off in response to the pull-down supplementary code.

DETAILED DESCRIPTION

Figure 1:
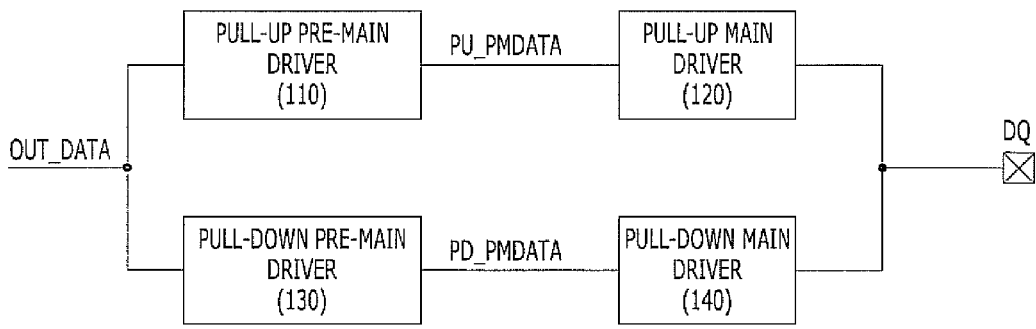
FIG. 1 is a block diagram illustrating a conventional data output circuit in support of a pre-emphasis operation.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

<First Embodiment>

Figure 2:
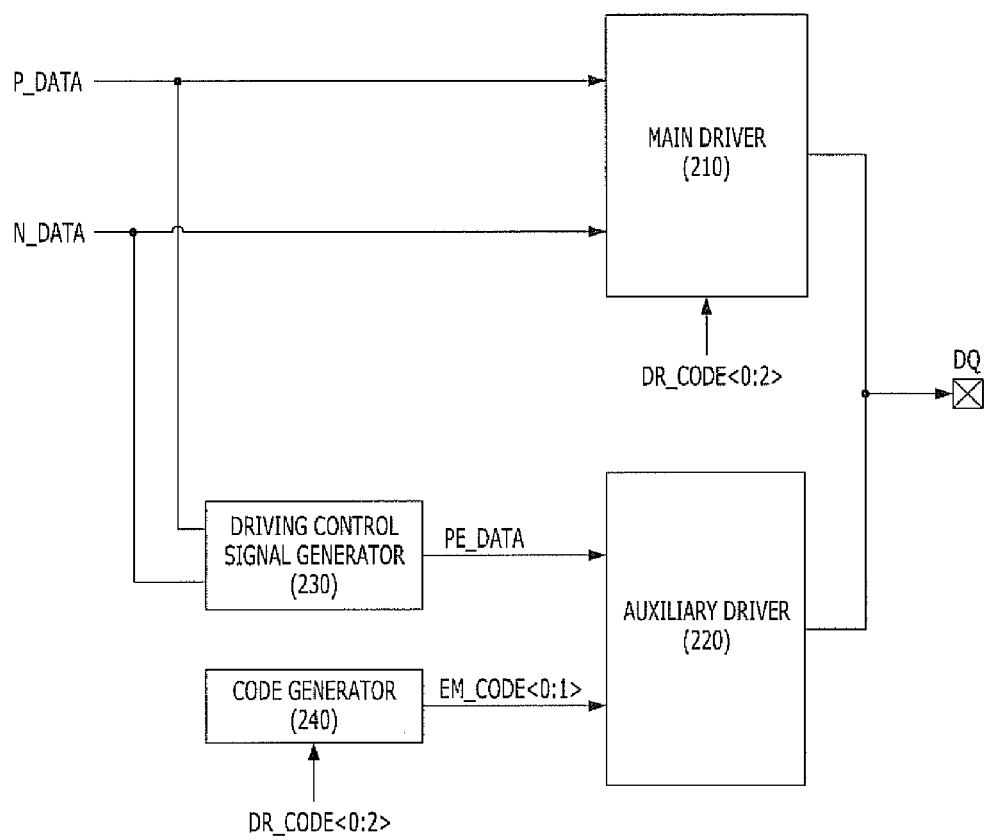
FIG. 2 is a block diagram illustrating a data output circuit in support of a pre-emphasis operation in accordance with a first embodiment of the present invention.

FIG. 2 is a block diagram illustrating a data output circuit in support of a pre-emphasis operation in accordance with a first embodiment of the present invention.

Referring to FIG. 2, the data output circuit in support of a pre-emphasis operation in accordance with the first embodiment of the present invention includes a main driver 210, an auxiliary driver 220, a driving control signal generator 230, and a code generator 240.

The main driver 210 receives an output data DATA and drives the output data DATA (P-DATA and N-DATA) to a data output pad DQ. Here, the driving force is controlled in response to an impedance code DR_CODE<0:2>.

The impedance code DR_CODE<0:2> is generated in a calibration circuit disposed around a ZQ pad. For this reason, the value is controlled according to a change in process, voltage and temperature (PVT).

For example, when the level of an external power source voltage VDD is increased, the value of the impedance code DR_CODE<0:2> may be controlled to be decreased. In this case, the main driver 210 operates in such a manner that the driving force is decreased in response to the increasing level of the external power source voltage VDD. As a result, the output data DATA may be driven to the data output pad DQ at a uniform driving force regardless of the change in the level of the external power source voltage VDD.

The code generator 240 generates a pre-emphasis/supplementary code EM_CODE<0:1> whose value is controlled according to the variation of the impedance code DR_CODE<0:2>.

Here, as described above, since the value of the impedance code DR_CODE<0:2> is controlled according to a change in the process, voltage and temperature (PVT), the pre-emphasis code EM_CODE<0:1>, too, whose value is controlled according to the variation of the impedance code DR_CODE<0:2> may have its value controlled according to the change in the process, voltage and temperature (PVT) as well.

Of course, the way the values of the impedance code DR_CODE<0:2> and the pre-emphasis code EM_CODE<0:1> vary and the variation ranges of the impedance code DR_CODE<0:2> and the pre-emphasis code EM_CODE<0:1> may be set differently. For example, a method of decreasing or increasing the value of the pre-emphasis code EM_CODE<0:1> may be adopted in response to the increasing value of the impedance code DR_CODE<0:2>. Also, the pre-emphasis code EM_CODE<0:1> may be made to have a variation range that is 1/2 or 1/3 as wide as the variation range of the value of the impedance code DR_CODE<0:2>.

The auxiliary driver 220 receives the output data DATA and drives the output data DATA to the data output pad DQ. Here, the driving force is controlled in response to the pre-emphasis code EM_CODE<0:1>.

The value of the pre-emphasis code EM_CODE<0:1>, as described above, is controlled according to a change in the process, voltage and temperature (PVT). Thus, the driving force of the auxiliary driver 220 may be controlled according to the change in the process, voltage and temperature (PVT).

For example, when the value of the impedance code DR_CODE<0:2> is controlled to be decreased according to the increasing level of the external power source voltage VDD, the value of the pre-emphasis code EM_CODE<0:1> may also be controlled to be decreased. In this case, the auxiliary driver 220 operates to have a decreasing driving force according to an increasing level of the external power source voltage VDD to reduce the strength of a pre-emphasis operation, or the auxiliary driver 220 operates to have an increasing driving force according to a decreasing level of the external power source voltage VDD to increase the strength of a pre-emphasis operation.

The driving control signal generator 230 generates a driving control signal PE_DATA that is enabled for a time period in response to the logic level of the output data DATA transitioning from a logic high level to a logic low level or from a logic low level to a logic high level, and controls the operation of the auxiliary driver 220. Here, since the logic level of the enabled driving control signal PE_DATA is decided based on the logic level of the output data DATA, the operation of the auxiliary driver 220 performed in a period where the driving control signal PE_DATA is enabled in response to an operation of driving the output data DATA to the data output pad DQ.

The driving control signal generator 230 is used to drive the auxiliary driver 220, which performs a pre-emphasis operation. In other words, the period where the auxiliary driver 220 performs the pre-emphasis operation includes a period where a time period passes from a timing point when the applied output data DATA transitions from a logic high level to a logic low level and a period where a time period passes from a timing point when the applied output data DATA transitions from a logic low level to a logic high level. A period where the auxiliary driver 220 has to operate is set based on the driving control signal PE_DATA generated in the driving control signal generator 230.

To sum up, the auxiliary driver 220 drives the output data DATA to the data output pad DQ with a driving force which is defined by the pre-emphasis code EM_CODE<0:1> for a time period which is defined by the driving control signal PE_DATA.

As described above, since the main driver 210, too, is driving the output data DATA to the data output pad DQ, the auxiliary driver 220 performs a driving operation for a pre-emphasis operation along with the driving control signal generator 230. Of course, since the driving force of the auxiliary driver 220 varies according to the pre-emphasis code EM_CODE<0:1>, the driving force of the auxiliary driver 220 may vary according to a change in the process, voltage and temperature (PVT).

<Second Embodiment>

Figure 3:
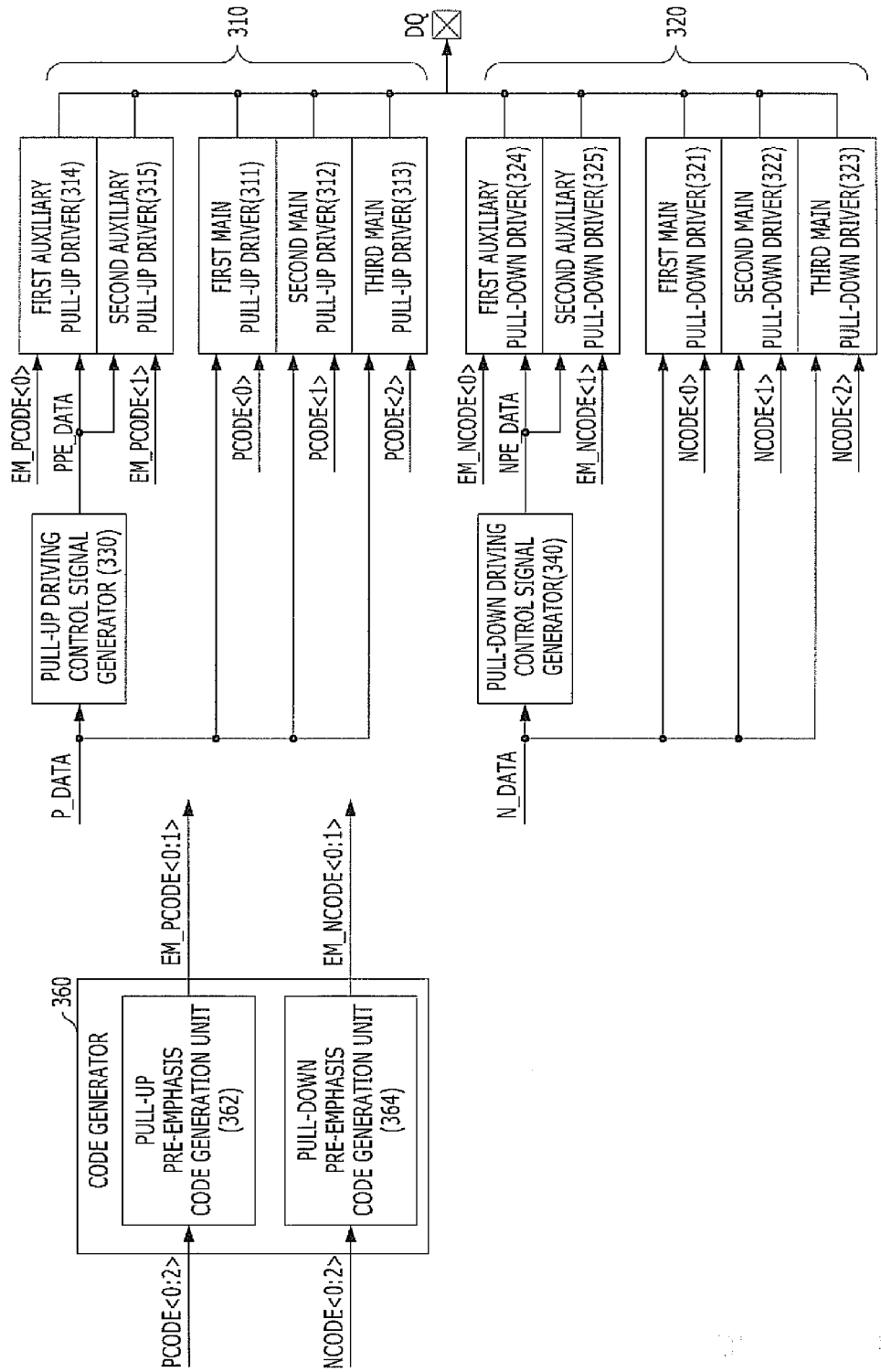
FIG. 3 is a block diagram illustrating a data output circuit in support of a pre-emphasis operation in accordance with a second embodiment of the present invention.

FIG. 3 is a block diagram illustrating a data output circuit in support of a pre-emphasis operation in accordance with a second embodiment of the present invention.

Referring to FIG. 3, the data output circuit in support of a pre-emphasis operation in accordance with the second embodiment of the present invention includes a pull-up driver 310, a pull-down driver 320, a pull-up driving control signal generator 330, a pull-down driving control signal generator 340, and a code generator 360.

The pull-up driver 310 receives an output data P_DATA and drives the output data P_DATA to a data output pad DQ by using a plurality of main pull-up drivers 311, 312 and 313 and a plurality of auxiliary pull-up drivers 314 and 315.

Here, the main pull-up drivers 311, 312 and 313 are controlled to be turned on/off in response to pull-up impedance codes PCODE<0>, PCODE<1> and PCODE<2>, and the auxiliary pull-up drivers 314 and 315 are controlled to be turned on/off in response to pull-up pre-emphasis/supplementary codes EM_PCODE<0> and EM_PCODE<1>.

The pull-down driver 321-323 receives an output data N_DATA and pull-down drives the output data N_DATA to the data output pad DQ, wherein the output pad DQ is pull-down driven by using a plurality of main pull-down drivers 321, 322 and 323 and a plurality of auxiliary pull-down drivers 324 and 325.

Here, the main pull-down drivers 321, 322 and 323 are controlled to be turned on/off in response to pull-down impedance codes NCODE<0>, NCODE<1> and NCODE<2>, and the auxiliary pull-down drivers 324 and 325 are controlled to be turned on/off in response to pull-down pre-emphasis codes EM_NCODE<0> and EM_NCODE<1>.

The pull-up impedance codes PCODE<0>, PCODE<1> and PCODE<2> that are used to turn on/off the operation of the main pull-up drivers 311, 312 and 313 among the constituent elements of the pull-up driver 310 and the pull-down impedance codes NCODE<0>, NCODE<1> and NCODE<2> that are used to turn on/off the operation of the main pull-down drivers 321, 322 and 323 among the constituent elements of the pull-down driver 320 are generated in a calibration circuit disposed around the ZQ pad. Therefore, the values of the pull-up impedance codes PCODE<0>, PCODE<1> and PCODE<2> and the values of the pull-down impedance codes NCODE<0>, NCODE<1> and NCODE<2> are controlled based on the change in the process, voltage and temperature (PVT).

The main pull-up drivers 311, 312 and 313 may include first to third main pull-up drivers 311, 312 and 313 whose operations are respectively controlled according to the values of first to third bits PCODE<0>, PCODE<1> and PCODE<2> of the pull-up impedance codes. The auxiliary pull-up drivers 314 and 315 include first and second auxiliary pull-up drivers 314 and 315 whose operations are respectively controlled according to the values of the first and second bits EM_PCODE<0> and EM_PCODE<1> of the pull-up pre-emphasis codes. The main pull-down drivers 321, 322 and 323 include first to third main pull-down drivers 321, 322 and 323 whose operations are respectively controlled according to first to third bits NCODE<0>, NCODE<1> and NCODE<2> of the pull-down impedance codes. The auxiliary pull-down drivers 324 and 325 include first and second auxiliary pull-down drivers 324 and 325 whose operations are respectively controlled according to first and second bits EM_NCODE<0> and EM_NCODE<1> of the pull-down pre-emphasis codes.

Here, the driving force relationship among the first to third main pull-up drivers 311, 312 and 313, the first to third main pull-down drivers 321, 322 and 323, the first and second auxiliary pull-up drivers 314 and 315, and the first and second auxiliary pull-down drivers 324 and 325 may be divided into the following two cases.

A first case is that the driving force of the first main pull-up driver 311 is greater than the driving force of the second main pull-up driver 312, and the driving force of the second main pull-up driver 312 is greater than the driving force of the third main pull-up driver 313. The driving force of the first main pull-down driver 321 is greater than the driving force of the second main pull-down driver 322, and the driving force of the second main pull-down driver 322 is greater than the driving force of the third main pull-down driver 323. Also, the driving force of the first auxiliary pull-up driver 314 is greater than the driving force of the second auxiliary pull-up driver 315, and the driving force of the first main pull-up driver 311 is N times as great as the driving force of the first auxiliary pull-up driver 314, where N is an integer greater than 2. The driving force of the first auxiliary pull-down driver 324 is greater than the driving force of the second auxiliary pull-down driver 325, and the driving force of the first main pull-down driver 321 is N times as great as the driving force of the first auxiliary pull-down driver 324, where N is an integer greater than 2.

The second case is that the first to third main pull-up drivers 311, 312 and 313 have the same driving force together, and the first to third main pull-down drivers 321, 322 and 323 have the same driving force together. Here, the first and second auxiliary pull-up drivers 314 and 315 have the same driving force, but the driving forces of the first to third main pull-up drivers 311, 312 and 313 are each N times as great as the driving forces of each of the first and second auxiliary pull-up drivers 314 and 315, where N is an integer greater than 2. Likewise, the first and second auxiliary pull-down drivers 324 and 325 have the same driving forces, but the driving forces of the first to third main pull-down drivers 321, 322 and 323 are each N times as great as the driving forces of each of the first and second auxiliary pull-down drivers 324 and 325, where N is an integer greater than 2.

Meanwhile, the code generator 360 generates a pull-up pre-emphasis code EM_PCODE<0:1> and a pull-down pre-emphasis code EM_NCODE<0:1> whose values are controlled according to the variation of the pull-up impedance codes PCODE<0>, PCODE<1> and PCODE<2> and the pull-down impedance codes NCODE<0>, NCODE<1> and NCODE<2>.

More specifically, the code generator 360 includes a pull-up pre-emphasis code generation unit 362 and a pull-down pre-emphasis code generation unit 364. The pull-up pre-emphasis code generation unit 362 varies the values of the pull-up pre-emphasis codes EM_PCODE<0> and EM_PCODE<1> by applying a different variation range according to the variation of the values of the pull-up impedance codes PCODE<0>, PCODE<1> and PCODE<2>. The pull-down pre-emphasis code generation unit 364 varies the values of the pull-down pre-emphasis codes EM_NCODE<0> and EM_NCODE<1> by applying a different variation range according to the variation of the values of the pull-down impedance codes NCODE<0>, NCODE<1> and NCODE<2>.

For example, the pull-up pre-emphasis code generation unit 362 operates in such a manner that the number of enabled bits among the first and second bits EM_PCODE<0> and EM_PCODE<1> of the pull-up pre-emphasis codes is increased according to the decreasing number of enabled bits among the first to third bits PCODE<0>, PCODE<1> and PCODE<2> of the pull-up impedance codes. Therefore, the variation range of the pull-up impedance codes PCODE<0>, PCODE<1> and PCODE<2> and the variation range of the pull-up pre-emphasis codes EM_PCODE<0> and EM_PCODE<1> are different.

Likewise, the pull-down pre-emphasis code generation unit 364 operates in such a manner that the number of enabled bits among the first and second bits EM_NCODE<0> and EM_NCODE<1> of the pull-down pre-emphasis codes is increased according to the decreasing number of enabled bits among the first to third bits NCODE<0>, NCODE<1> and NCODE<2> of the pull-down impedance codes. Therefore, the variation range of the pull-down impedance codes NCODE<0>, NCODE<1> and NCODE<2> and the variation range of the pull-down pre-emphasis codes EM_NCODE<0> and EM_NCODE<1> are different.

Figure 4A:
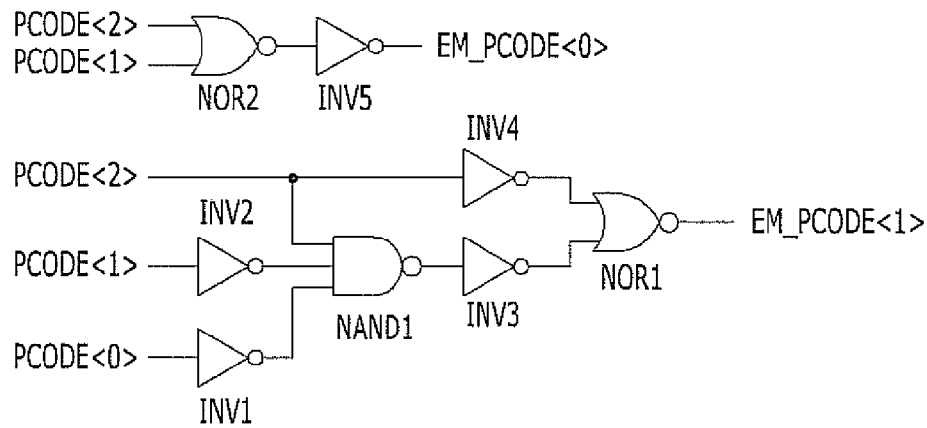
FIGS. 4A and 4B are circuit diagrams illustrating a code generator in detail among the constituent elements of the data output circuit in support of a pre-emphasis operation shown in FIG. 3 in accordance with the second embodiment of the present invention.

Referring to FIG. 4A illustrating a detailed circuit structure of the pull-up pre-emphasis code generation unit 362, although the pull-up pre-emphasis codes EM_PCODE<0> and EM_PCODE<1> are generated in response to the pull-up impedance codes PCODE<0>, PCODE<1> and PCODE<2>, the variation ranges are different from each other.

More specifically, referring to FIG. 4A, the pull-up pre-emphasis code generation unit 362 includes first and second inverters INV1 and INV2 for respectively inverting the first and second bits PCODE<0>, PCODE<1> of the pull-up impedance codes; a first NAND gate NAND1 and a third inverter INV3 that perform an AND operation on the output signal of the first inverter INV1 and the output signal of the second inverter INV2; a fourth inverter INV4 for inverting the third bit PCODE<2> of the pull-up impedance codes; a first NOR gate NOR<1> for performing a NOR operation on the output signal of the third inverter INV3 and the output signal of the fourth inverter INV4 and outputting the second bit EM_PCODE<1> of the pull-up pre-emphasis codes; and a second NOR gate NOR2 and a fifth inverter INV5 for performing an OR operation on the second and third bits PCODE<1> and PCODE<2> of the pull-up impedance codes and outputting the first bit EM_PCODE<0> of the pull-up pre-emphasis codes.

Figure 4B:
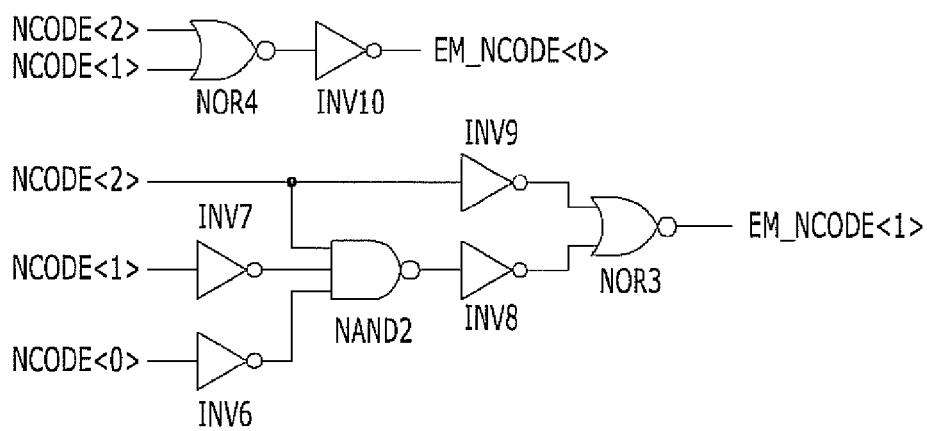

Referring to FIG. 4B illustrating a detailed circuit structure of the pull-down pre-emphasis code generation unit 364, although the pull-down pre-emphasis codes EM_NCODE<0> and EM_NCODE<1> are generated in response to the pull-down impedance codes NCODE<0>, NCODE<1> and NCODE<2>, the variation ranges are different from each other.

More specifically, referring to FIG. 4B, the pull-down pre-emphasis code generation unit 364 includes sixth and seventh inverters INV6 and INV7 for respectively inverting the first and second bits NCODE<0>, NCODE<1> of the pull-down impedance codes; a second NAND gate NAND2 and an eighth inverter INV8 that perform an AND operation on the output signal of the sixth inverter INV6 and the output signal of the seventh inverter INV7; a ninth inverter INV9 for inverting the third bit NCODE<2> of the pull-down impedance codes; a third NOR gate NOR<3> for performing a NOR operation on the output signal of the eighth inverter INV8 and the output signal of the ninth inverter INV9 and outputting the second bit EM_NCODE<1> of the pull-down pre-emphasis codes; and a fourth NOR gate NOR4 and a tenth inverter INV10 for performing an OR operation on the second and third bits NCODE<1> and NCODE<2> of the pull-down impedance codes and outputting the first bit EM_NCODE<0> of the pull-down pre-emphasis codes.

As described above, since the values of the pull-up impedance codes PCODE<0>, PCODE<1> and PCODE<2> and the pull-down impedance codes NCODE<0>, NCODE<1> and NCODE<2> are controlled according to a change in the process, voltage and temperature (PVT), the values of the pull-up pre-emphasis codes EM_PCODE<0> and EM_PCODE<1> and the values of the pull-down pre-emphasis codes EM_NCODE<0> and EM_NCODE<1> are controlled according to the change in the process, voltage and temperature (PVT) as well.

Figure 5A:
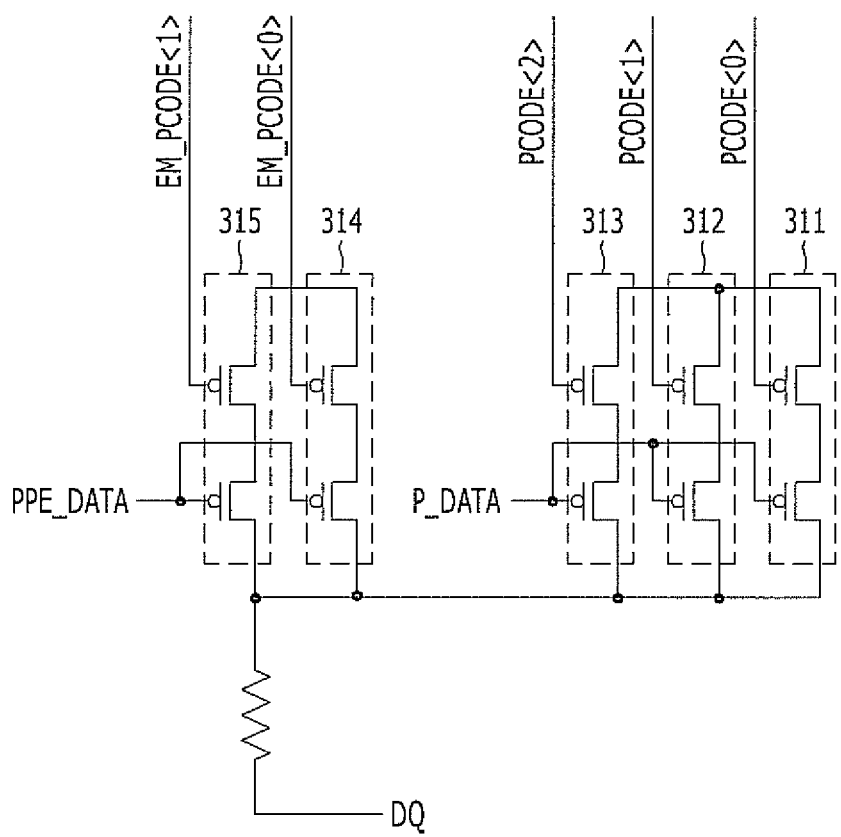
FIGS. 5A and 5B are circuit diagrams illustrating a plurality of auxiliary drivers in detail among the constituent elements of the data output circuit in support of a pre-emphasis operation shown in FIG. 3 in accordance with the second embodiment of the present invention.
Figure 5B:
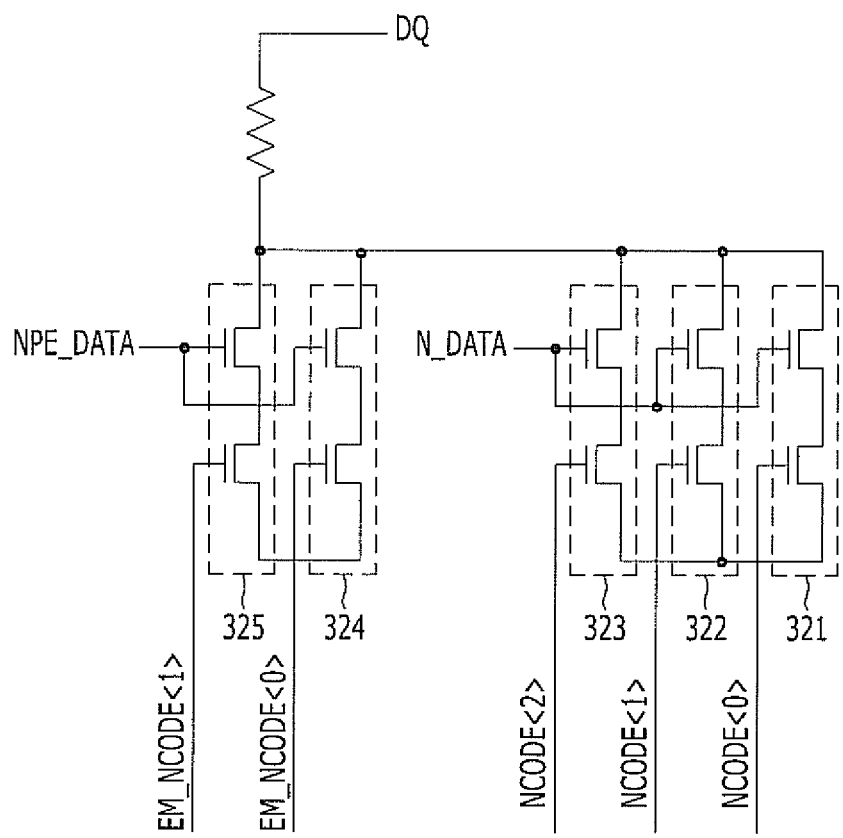

Referring to FIG. 5A, the main pull-up drivers 311, 312 and 313 and the auxiliary pull-up drivers 314 and 315 include PMOS transistors individually and it may be seen from this that the main pull-up drivers 311, 312 and 313 and the auxiliary pull-up drivers 314 and 315 are constituent elements for deciding whether to pull-up drive the external power source voltage VDD to the data output pad DQ or not. FIG. 5B shows that the main pull-down drivers 321, 322 and 323 and the auxiliary pull-down drivers 324 and 325 include NMOS transistors individually and it may be seen from this that the main pull-down drivers 321, 322 and 323 and the auxiliary pull-down drivers 324 and 325 are constituent elements for deciding whether to pull-down drive the external ground voltage VSS to the data output pad DQ or not. Therefore, when there is a change in the process, voltage and temperature (PVT), the values of the pull-up impedance codes PCODE<0>, PCODE<1> and PCODE<2> and the values of the pull-down impedance codes NCODE<0>, NCODE<1> and NCODE<2> vary in opposite to each other.

In other words, the main pull-up drivers 311, 312 and 313 and the auxiliary pull-up drivers 314 and 315 that include the PMOS transistors have the pull-up impedance codes PCODE<0>, PCODE<1> and PCODE<2> of '000' and the pull-up pre-emphasis codes EM_PCODE<0> and EM_PCODE<1> of '00'. The main pull-up drivers 311, 312 and 313 and the auxiliary pull-up drivers 314 and 315 are all enabled when the pull-up impedance codes PCODE<0>, PCODE<1> and PCODE<2> and the pull-up pre-emphasis codes EM_PCODE<0> and EM_PCODE<1> have the smallest value, and thus the main pull-up drivers 311, 312 and 313 and the auxiliary pull-up drivers 314 and 315 come to have the maximal driving force. When the main pull-up drivers 311, 312 and 313 and the auxiliary pull-up drivers 314 and 315 that include the PMOS transistors have the pull-up impedance codes PCODE<0>, PCODE<1> and PCODE<2> of '111' and the pull-up pre-emphasis codes EM_PCODE<0> and EM_PCODE<1> of '11', the main pull-up drivers 311, 312 and 313 and the auxiliary pull-up drivers 314 and 315 are all disabled when the pull-up impedance codes PCODE<0>, PCODE<1> and PCODE<2> and the pull-up pre-emphasis codes EM_PCODE<0> and EM_PCODE<1> have the greatest value, and thus the main pull-up drivers 311, 312 and 313 and the auxiliary pull-up drivers 314 and 315 come to have the minimal driving force.

However, the main pull-down drivers 321, 322 and 323 and the auxiliary pull-down drivers 324 and 325 that include NMOS transistors have the pull-down impedance codes NCODE<0>, NCODE<1> and NCODE<2> of '000' and the pull-down pre-emphasis codes EM_NCODE<0> and EM_NCODE<1> of '00'. The main pull-down drivers 321, 322 and 323 and the auxiliary pull-down drivers 324 and 325 are all disabled when the pull-down impedance codes NCODE<0>, NCODE<1> and NCODE<2> and the pull-down pre-emphasis codes EM_NCODE<0> and EM_NCODE<1> have the smallest value, and thus the main pull-down drivers 321, 322 and 323 and the auxiliary pull-down drivers 324 and 325 come to have the minimal driving force. When main pull-down drivers 321, 322 and 323 and the auxiliary pull-down drivers 324 and 325 that include the NMOS transistors have the pull-down impedance codes NCODE<0>, NCODE<1> and NCODE<2> of '111' and the pull-down pre-emphasis codes EM_NCODE<0> and EM_NCODE<1> of '11', the main pull-down drivers 321, 322 and 323 and the auxiliary pull-down drivers 324 and 325 are all enabled when the pull-down impedance codes NCODE<0>, NCODE<1> and NCODE<2> and the pull-down pre-emphasis codes EM_NCODE<0> and EM_NCODE<1> have the greatest value, and thus the main pull-down drivers 321, 322 and 323 and the auxiliary pull-down drivers 324 and 325 come to have the maximal driving force.

Therefore, the pull-up impedance codes PCODE<0>, PCODE<1> and PCODE<2> and the pull-up pre-emphasis codes EM_PCODE<0> and EM_PCODE<1> may be controlled to have their values increasing according to an increasing level of the external power source voltage VDD, and to have their values decreasing according to a decreasing level of the external power source voltage VDD. However, the pull-down impedance codes NCODE<0>, NCODE<1> and NCODE<2> and the pull-down pre-emphasis codes EM_NCODE<0> and EM_NCODE<1> may be controlled to have their values decreasing according to an increasing level of the external power source voltage VDD, and to have their values increasing according to a decreasing level of the external power source voltage VDD.

In this case, the main pull-up drivers 311, 312 and 313 and the main pull-down drivers 321, 322 and 323 have their driving forces decreasing according to the increasing level of the external power source voltage VDD, and have their driving forces increasing according to the decreasing level of the external power source voltage VDD. Therefore, the output data P_DATA and N_DATA to the data output pad DQ may be driven with a uniform driving force regardless of a change in the level of the external power source voltage VDD.

Also, the auxiliary pull-up drivers 314 and 315 and the auxiliary pull-down drivers 324 and 325 apply a relatively small pre-emphasis operation driving force according to the increasing level of the external power source voltage VDD, and the auxiliary pull-up drivers 314 and 315 and the auxiliary pull-down drivers 324 and 325 apply a relatively great pre-emphasis operation driving force according to the decreasing level of the external power source voltage VDD. In this way, the output data P_DATA and N_DATA are driven to the data output pad DQ at a uniform slew rate, regardless of a change in the level of the external power source voltage VDD.

Figure 6A:
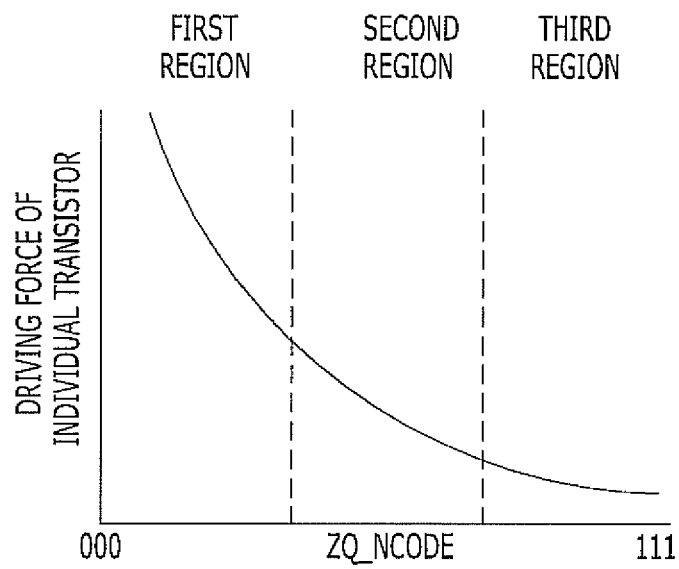
FIGS. 6A and 6B are a graph and a table describing the operation of the code generator among the constituent elements of the data output circuit in support of a pre-emphasis operation shown in FIG. 3 in accordance with the second embodiment of the present invention.

The relationships among the variation of the values of the above-described pull-up impedance codes PCODE<0>, PCODE<1> and PCODE<2>, the variation of the values of the pull-up pre-emphasis codes EM_PCODE<0> and EM_PCODE<1>, and the variation of the level of the external power source voltage VDD may be summarized as shown in FIG. 6A.

Figure 6B:
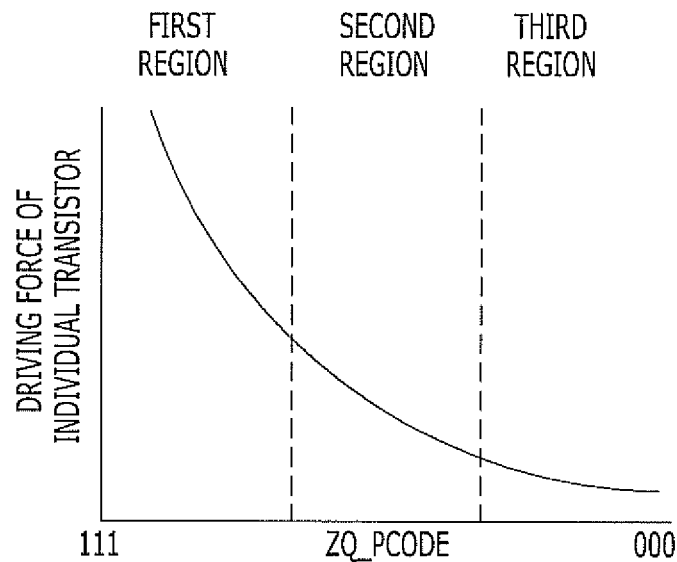

Similarly, the relationships among the variation of the values of the above-described pull-down impedance codes NCODE<0>, NCODE<1> and NCODE<2>, the variation of the values of the pull-down pre-emphasis codes EM_NCODE<0> and EM_NCODE<1>, and the variation of the level of the external power source voltage VDD may be summarized as shown in FIG. 6B.

The pull-up driving control signal generator 330 generates a pull-up driving control signal PPE_DATA that is enabled for a time period in response to the transition of the logic level of the output data P_DATA from a logic high level to a logic low level to control the operation of the auxiliary pull-up drivers 314 and 315. Here, since the auxiliary pull-up drivers 314 and 315 include PMOS transistors, the pull-up driving control signal PPE_DATA maintains a logic low level during a time that is set from the timing point when the logic level of the output data P_DATA transitions from a logic high level to a logic low level.

The pull-down driving control signal generator 340 generates a pull-down driving control signal NPE_DATA that is enabled for a time period in response to the transition of the logic level of the output data N_DATA from a logic low level to a logic high level to control the operation of the auxiliary pull-down drivers 324 and 325. Here, since the auxiliary pull-down drivers 324 and 325 include NMOS transistors, the pull-down driving control signal NPE_DATA maintains a logic high level during a time that is set from the timing point when the logic level of the output data N_DATA transitions from a logic low level to a logic high level.

Figure 7A:
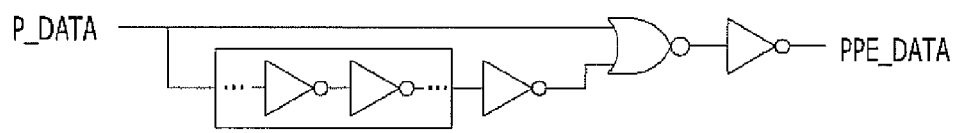
FIGS. 7A and 7B are circuit diagrams illustrating a pull-up driving control signal generator and a pull-down driving control signal generator among the constituent elements of the data output circuit in support of a pre-emphasis operation shown in FIG. 3 in accordance with the second embodiment of the present invention.
Figure 7B:
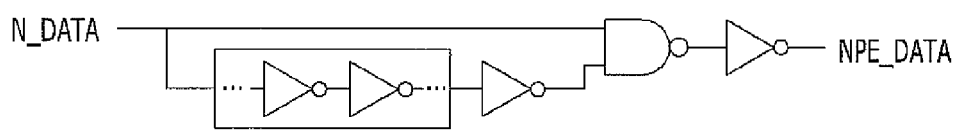

FIG. 7A shows the detailed circuit structure of the above-described pull-up driving control signal generator 330, and FIG. 7B shows the detailed circuit structure of the above-described pull-down driving control signal generator 340.

The pull-up driving control signal generator 330 and the pull-down driving control signal generator 340 provide control signals to the auxiliary pull-up drivers 314 and 315 and the auxiliary pull-down drivers 324 and 325 that perform a pre-emphasis operation. Here, the period where the auxiliary pull-up drivers 314 and 315 operate is the period where a time period passes from a timing point when the logic level of the output data P_DATA transitions from the logic high level to the logic low level, and the period where the auxiliary pull-down drivers 324 and 325 operate is the period where a time period passes from a timing point when the logic level of the output data N_DATA transitions from the logic low level to the logic high level. Therefore, the periods where the auxiliary pull-up drivers 314 and 315 and the auxiliary pull-down drivers 324 and 325 operate are decided based on the pull-up driving control signal PPE_DATA and the pull-down driving control signal NPE_DATA that are generated in the pull-up driving control signal generator 330 and the pull-down driving control signal generator 340, respectively.

Thus, the auxiliary pull-up drivers 314 and 315 and the auxiliary pull-down drivers 324 and 325 drive the output data P_DATA and N_DATA to the data output pad DQ with a driving force defined by the pull-up pre-emphasis codes EM_PCODE<0> and EM_PCODE<1> and the pull-down pre-emphasis codes EM_NCODE<0> and EM_NCODE<1> during a time period defined by the pull-up driving control signal PPE_DATA and the pull-down driving control signal NPE_DATA.

Here, as described above, while the main pull-up drivers 311, 312 and 313 and the main pull-down drivers 321, 322 and 323 drive the output data P_DATA and N_DATA to the data output pad DQ, the auxiliary pull-up drivers 314 and 315 and the auxiliary pull-down drivers 324 and 325 perform a driving operation for a pre-emphasis operation along with the pull-up driving control signal generator 330 and the pull-down driving control signal generator 340. Here, since the driving forces of the auxiliary pull-up drivers 314 and 315 and the auxiliary pull-down drivers 324 and 325 vary according to the pull-up pre-emphasis codes EM_PCODE<0> and EM_PCODE<1> and the pull-down pre-emphasis codes EM_NCODE<0> and EM_NCODE<1>, the driving forces of the auxiliary pull-up drivers 314 and 315 and the auxiliary pull-down drivers 324 and 325 may vary according to a change in the process, voltage and temperature (PVT).

FIGS. 8A to 8D are timing diagrams describing the operation of the data output circuit in support of a pre-emphasis operation shown in FIG. 3 in accordance with the second embodiment of the present invention.

Figure 8A:
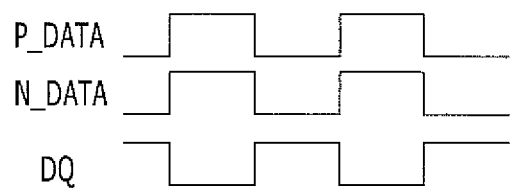
FIGS. 8A to 8D are timing diagrams describing the operation of the data output circuit in support of a pre-emphasis operation shown in FIG. 3 in accordance with the second embodiment of the present invention.

First, FIG. 8A shows an ideal operation of a data output circuit that does not perform a pre-emphasis operation.

FIG. 8A shows a case where the main pull-up drivers 311, 312 and 313 and the main pull-down drivers 321, 322 and 323 operate in response to the output data P_DATA and N_DATA, and the main pull-up drivers 311, 312 and 313 include PMOS transistors. Since the main pull-down drivers 321, 322 and 323 include NMOS transistors, the output data P_DATA and N_DATA are inverted and driven to the data output pad DQ.

Figure 8B:
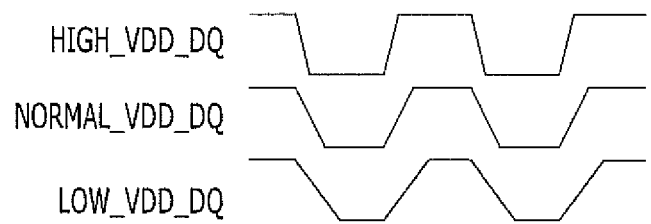

FIG. 8B shows the slew rate of a data driven to the data output pad DQ varies as the level of the external power source voltage VDD varies in a data output circuit that does not perform a pre-emphasis operation.

In other words, as the level of the external power source voltage VDD becomes higher, the slew rate of a data driven to the data output pad DQ becomes small, and as the level of the external power source voltage VDD becomes lower, the slew rate of a data driven to the data output pad DQ becomes great.

Figure 8C:
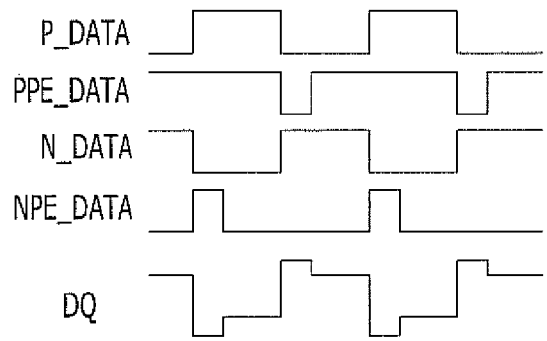

FIG. 8C shows an ideal operation of a data output circuit performing a pre-emphasis operation.

In other words, FIG. 8C shows a case where all of the main pull-up drivers 311, 312 and 313, the auxiliary pull-up drivers 314 and 315, the main pull-down drivers 321, 322 and 323, and the auxiliary pull-down drivers 324 and 325 operate in response to the output data P_DATA and N_DATA. Since the main pull-up drivers 311, 312 and 313 and the auxiliary pull-up drivers 314 and 315 include PMOS transistors, and the main pull-down drivers 321, 322 and 323 and the auxiliary pull-down drivers 324 and 325 include NMOS transistors, the output data P_DATA and N_DATA are inverted and driven to the data output pad DQ.

Also, since a pre-emphasis operation is performed in a period where the pull-up driving control signal PPE_DATA is enabled to a logic low level and a period where the pull-down driving control signal NPE_DATA is enabled to a logic high level, it may be seen that the data driven to the data output pad DQ is driven with a higher driving force when the data driven to the data output pad DQ transitions from a logic high level to a logic low level and when the data driven to the data output pad DQ transitions from a logic low level to a logic high level.

Figure 8D:
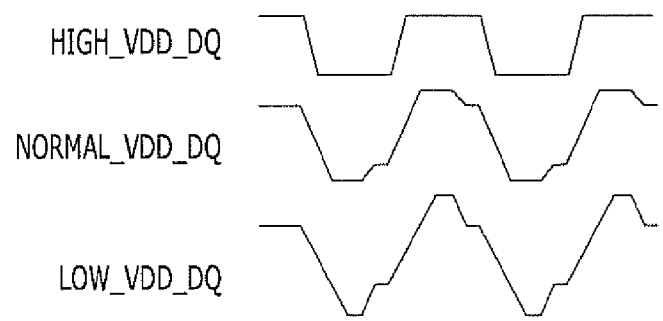

FIG. 8D shows that a data output circuit performing a pre-emphasis operation may maintain the slew rate of the data driven to the data output pad DQ although the level of the external power source voltage VDD is changed.

In other words, when the level of the external power source voltage VDD is high, the strength of the driving force based on the pre-emphasis operation is reduced, and when the level of the external power source voltage VDD is low, the strength of the driving force based on the pre-emphasis operation is increased. As a result, the slew rate of the data driven to the data output pad DQ is maintained at a uniform level, regardless of the change in the level of the external power source voltage VDD.

According to an embodiment of the present invention described above, the pre-emphasis driving force of a data output circuit in support of a pre-emphasis operation is controlled according to a change in the process, voltage and temperature (PVT) by using a pre-emphasis code whose value varies according to the variation of the value of an impedance code and performing the pre-emphasis operation.

Therefore, output data may be driven at a uniform slew rate regardless of the change in the process, voltage and temperature (PVT).

According to an embodiment of the present invention, a data output circuit in support of a pre-emphasis operation may control a pre-emphasis driving force according to a change in process, voltage and temperature (PVT) by using a pre-emphasis code whose value varies according to a change in an impedance code value and performing a pre-emphasis operation.

Therefore, the data output circuit may drive an output data while maintaining a uniform slew rate regardless of a change in the process, voltage and temperature (PVT).

While the present invention has been described with respect to the specific embodiments, it will be apparent to those skilled in the art that various changes and modifications may be made without departing from the spirit and scope of the invention as defined in the following claims.

For example, the above-description of the pull-up impedance codes PCODE<0>, PCODE<1> and PCODE<2> and the pull-down impedance codes NCODE<0>, NCODE<1> and NCODE<2> is exemplary only, where the number of the impedance code and the pre-emphasis code may be modified according to different design needs.

Also, the position and the kind of the logic gates and transistors exemplified in the above-described embodiment are realized differently according to the polarity of an input signal.

What is claimed is:

1. A semiconductor device, comprising:
   a code generator configured to generate a supplementary code with a value changing in response to a variation of an impedance code;
   a main driver configured to receive an output data and the impedance code and drive the received output data to a data output pad, wherein a driving force of the main driver is controlled based on the impedance code;
   an auxiliary driver configured to receive the output data and the supplementary code and drive the received output data to the data output pad, wherein a driving force of the auxiliary driver is controlled based on the supplementary code: and
   a driving control signal generator configured to generate a driving control signal enabled for a time period in response to a logic level change of the output data to control an operation of the auxiliary driver.

2. The semiconductor device of claim 1, wherein the impedance code has a value controlled according to a change in process, voltage and temperature (PVT).

3. The semiconductor device of claim 1, wherein the auxiliary driver is enabled to drive the data output pad during an initial period after each change of the output data and is disabled after the initial period.

4. The semiconductor device of claim 1, wherein the code generator is configured to receive the impedance code and logically combine the impedance code to produce the supplementary code.

5. A semiconductor device, comprising:
   a code generator configured to generate a pull-up supplementary code and a pull-down supplementary code, wherein the pull-up supplementary code and the pull-down supplementary code change in response to a variation of a pull-up impedance code and a variation of a pull-down impedance code, respectively;
   a pull-up driver configured to receive an output data and pull-up drive a data output pad by using a plurality of main pull-up drivers and a plurality of auxiliary pull-up drivers; and
   a pull-down driver configured to receive the output data and pull-down drive the data output pad by using a plurality of main pull-down drivers and a plurality of auxiliary pull-down drivers,
   wherein the main pull-up drivers are controlled to be turned on/off in response to the pull-up impedance code and the auxiliary pull-up drivers are controlled to be turned on/off in response to the pull-up supplementary code, and
   the main pull-down drivers are controlled to be turned on/off in response to the pull-down impedance code, and the auxiliary pull-down drivers are controlled to be turned on/off in response to the pull-down supplementary code.

6. The semiconductor device of claim 5, wherein the main pull-up drivers and the auxiliary pull-up drivers each comprise a PMOS transistor, and the main pull-down drivers and the auxiliary pull-down drivers each comprise an NMOS transistor.

7. The semiconductor device of claim 5, wherein the pull-up impedance code and the pull-down impedance code have values varying in opposite to each other according to a change in process, voltage and temperature (PVT).

8. The semiconductor device of claim 7, wherein the pull-up impedance code has a value decreasing according to a decreasing level of an external power source voltage and has a value increasing according to an increasing level of the external power source voltage, and the pull-down impedance code has a value increasing according to a decreasing level of the external power source voltage and has a value decreasing according to an increasing level of the external power source voltage.

9. The semiconductor device of claim 7, wherein the code generator comprises:

a pull-up supplementary code generation unit configured to vary a value of the pull-up supplementary code with a different variation range that is decided according to a variation of a value of the pull-up impedance code; and a pull-down supplementary code generation unit configured to vary a value of the pull-down supplementary code with a different variation range that is decided according to a variation of a value of the pull-down impedance code.

10. The semiconductor device of claim 7, wherein the main pull-up drivers are first to third main pull-up drivers having operations respectively controlled in response to first to third bit values of the pull-up impedance code;

the auxiliary pull-up drivers are first and second auxiliary pull-up drivers having operations respectively controlled in response to first and second bit values of the pull-up supplementary code;

the main pull-down drivers are first to third main pull-down drivers having operations respectively controlled in response to first to third bit values of the pull-down impedance code; and the auxiliary pull-down drivers are first and second auxiliary pull-down drivers having operations respectively controlled in response to first and second bit values of the pull-down supplementary code.

11. The semiconductor device of claim 10, wherein a driving strength of the first main pull-up driver has a greater value than a driving strength of the second main pull-up driver, and a driving strength of the second main pull-up driver has a greater value than a driving strength of the third main pull-up driver, and a driving strength of the second main pull-down driver has a greater value than a driving strength of the second main pull-down driver, and a driving strength of the second main pull-down driver has a greater value than a driving strength of the third main pull-down driver.

12. The semiconductor device of claim 11, wherein a driving strength of the first auxiliary pull-up driver is greater than a driving strength of the second auxiliary pull-up driver, and a driving strength of the first main pull-up driver is N times greater than a driving strength of the first auxiliary pull-up driver, wherein N is an integer greater than 2, and a driving strength of the first auxiliary pull-down driver is greater than a driving strength of the second auxiliary pull-down driver, and a driving strength of the first main pull-down driver is greater than a driving strength of the first auxiliary pull-down driver.

13. The semiconductor device of claim 10, wherein the first to third main pull-up drivers have the same driving strength, and the first to third main pull-down drivers have the same driving strength.

14. The semiconductor device of claim 13, wherein the first and second auxiliary pull-up drivers have the same driving strength, where a driving strength of the first to third main pull-up drivers is N times greater than the driving strength of the first and second auxiliary pull-up drivers and N is an integer greater than 2, and the first and second auxiliary pull-down drivers have the same driving strength, where a driving strength of the first to third main pull-down drivers is N times greater than the driving strength of the first and second auxiliary pull-down drivers and N is an integer greater than 2.

15. The semiconductor device of claim 10, wherein the code generator comprises:

a pull-up supplementary code generation unit configured to increase the number of bits that are enabled among the first and second bits of the pull-up supplementary code as the number of enabled bits among the first to third bits of the pull-up impedance code decreases; and a pull-down supplementary code generation unit for increasing the number of bits that are enabled among the first and second bits of the pull-down supplementary code as the number of enabled bits among the first to third bits of the pull-down impedance code decreases.

16. The semiconductor device of claim 15, wherein the pull-up supplementary code generation unit comprises:

first and second inverters configured to respectively invert first and second bits of the pull-up impedance code;

a first NAND gate and a third inverter configured to perform an AND operation on an output signal of the first inverter and an output signal of the second inverter;

a fourth inverter configured to invert a third bit of the pull-up impedance code;

a first NOR gate configured to perform a NOR operation on an output signal of the third inverter and an output signal of a fourth inverter and output a second bit of the pull-up supplementary code; and a second NOR gate and a fifth inverter configured to perform an OR operation on second and third bits of the pull-up impedance code and output a first bit of the pull-up supplementary code.

17. The semiconductor device of claim 16, wherein the pull-down supplementary code generation unit comprises:

sixth and seventh inverters configured to respectively invert first and second bits of the pull-down impedance code;

a second NAND gate and an eighth inverter configured to perform an AND operation on an output signal of the sixth inverter and an output signal of the seventh inverter;

a ninth inverter configured to invert a third bit of the pull-down impedance code;

a third NOR gate configured to perform a NOR operation on an output signal of the eighth inverter and an output signal of a ninth inverter and output a second bit of the pull-down supplementary code; and a fourth NOR gate and a tenth inverter configured to perform an OR operation on second and third bits of the pull-down impedance code and output a first bit of the pull-down supplementary code.

18. The semiconductor device of claim 5, further comprising:

a pull-up driving control signal generator configured to generate a pull-up driving control signal which is enabled for a time period in response to a logic level of the output data transitioning from a logic high level to a logic low level and controls operations of the auxiliary pull-up drivers; and a pull-down driving control signal generator configured to generate a pull-down driving control signal which is enabled for a time period in response to a logic level of the output data transitioning from a logic low level to a logic high level and controls operations of the auxiliary pull-down drivers.

* * * * *